(12) United States Patent
Yamamoto

(10) Patent No.: US 8,475,941 B2
(45) Date of Patent: Jul. 2, 2013

(54) HARD FILM, PLASTIC WORKING DIE, PLASTIC WORKING METHOD, AND TARGET FOR HARD FILM

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 258 days.

(21) Appl. No.: 12/882,565

(22) Filed: Sep. 15, 2010

(65) Prior Publication Data

US 2011/0079069 A1 Apr. 7, 2011

(30) Foreign Application Priority Data

Oct. 2, 2009 (JP) ................................. 2009-230936

(51) Int. Cl.
*B32B 9/00* (2006.01)

(52) U.S. Cl.
USPC ................ 428/697; 106/286.1; 106/286.2; 106/286.4; 106/286.5; 106/286.8; 106/287.18; 106/287.19; 428/698; 428/699; 428/704

(58) Field of Classification Search
USPC .......... 106/286.1, 286.2, 286.4, 286.5, 286.8, 106/287.18, 287.19; 428/697, 698, 699, 704
See application file for complete search history.

(56) References Cited

U.S. PATENT DOCUMENTS

| | | | |
|---|---|---|---|
| 6,824,601 B2 * | 11/2004 | Yamamoto et al. ......... | 106/286.2 |
| 7,348,074 B2 * | 3/2008 | Derflinger .................... | 428/699 |
| 7,521,131 B2 * | 4/2009 | Yamamoto .................... | 428/698 |
| 7,537,822 B2 * | 5/2009 | Ishikawa ....................... | 428/699 |
| 7,763,366 B2 * | 7/2010 | Yamamoto et al. ........... | 428/697 |
| 7,967,275 B2 * | 6/2011 | Yamamoto .................... | 428/698 |
| 8,025,990 B2 * | 9/2011 | Yamamoto et al. ........... | 428/697 |
| 8,043,728 B2 * | 10/2011 | Yamamoto .................... | 428/697 |
| 8,119,262 B2 * | 2/2012 | Åstrand ....................... | 428/698 |
| 2002/0168552 A1 | 11/2002 | Yamamoto et al. | |
| 2004/0237840 A1 | 12/2004 | Yamamoto et al. | |
| 2005/0186448 A1 | 8/2005 | Yamamoto et al. | |
| 2008/0038503 A1 | 2/2008 | Yamamoto | |
| 2008/0166583 A1 | 7/2008 | Astrand | |
| 2008/0166588 A1 | 7/2008 | Astrand | |
| 2008/0171183 A1 | 7/2008 | Yamamoto | |
| 2008/0203272 A1 | 8/2008 | Fujiwara et al. | |
| 2009/0269614 A1 | 10/2009 | Yamamoto et al. | |

FOREIGN PATENT DOCUMENTS

| | | |
|---|---|---|
| DE | 19819782 | * 10/1999 |
| EP | 1 947 209 A1 | 7/2008 |
| JP | 2002-371352 | 12/2002 |
| JP | 2003-71611 | 3/2003 |
| JP | 2006-123159 | 5/2006 |

(Continued)

OTHER PUBLICATIONS

Japanese Office Action issued Feb. 21, 2012, in Patent Application No. 2009-230936 (with English-language translation).

(Continued)

Primary Examiner — Archene Turner

(74) Attorney, Agent, or Firm — Oblon, Spivak, McClelland, Maier & Neustadt, L.L.P.

(57) ABSTRACT

There is provided a hard film excellent in wear resistance. The hard film in accordance with the present invention includes $(Ti_aCr_bAl_cL_d)(B_xC_yN_z)$ in terms of composition, in which the L is at least one of Si and Y, and the a, b, c, d, x, y, and z each denote the atomic ratio, and satisfy: $0.1 \leq a < 0.3$; $0.3 < b < 0.6$; $0.2 \leq c < 0.35$; $0.01 \leq d < 0.1$; $a+b+c+d=1$; $x \leq 0.1$; $y \leq 0.1$; $0.8 \leq z \leq 1$; and $x+y+z=1$.

4 Claims, 1 Drawing Sheet

FOREIGN PATENT DOCUMENTS

| | | |
|---|---|---|
| JP | 2007-136597 | 6/2007 |
| JP | 2007-185739 | 7/2007 |
| JP | 2007-204820 | 8/2007 |
| JP | 2007-254785 * | 10/2007 |
| JP | 2008-24976 | 2/2008 |
| JP | 2008-63654 | 3/2008 |
| JP | 2008-105107 | 5/2008 |
| JP | 2008-162009 | 7/2008 |
| JP | 2008-207219 | 9/2008 |
| JP | 2010-168638 | 8/2010 |
| WO | WO 2008/079088 A2 | 7/2008 |

OTHER PUBLICATIONS

H. Ezura, et al., "Micro-hardness, microstructures and thermal stability of (Ti,Cr,Al,Si)N films deposited by cathodic arc method", VACUUM, vol. 82, No. 5, 2008, pp. 476-481.

Extended European Search Report issued Mar. 30, 2011, in Application No. / Patent No. 10009513.2-2122.

* cited by examiner

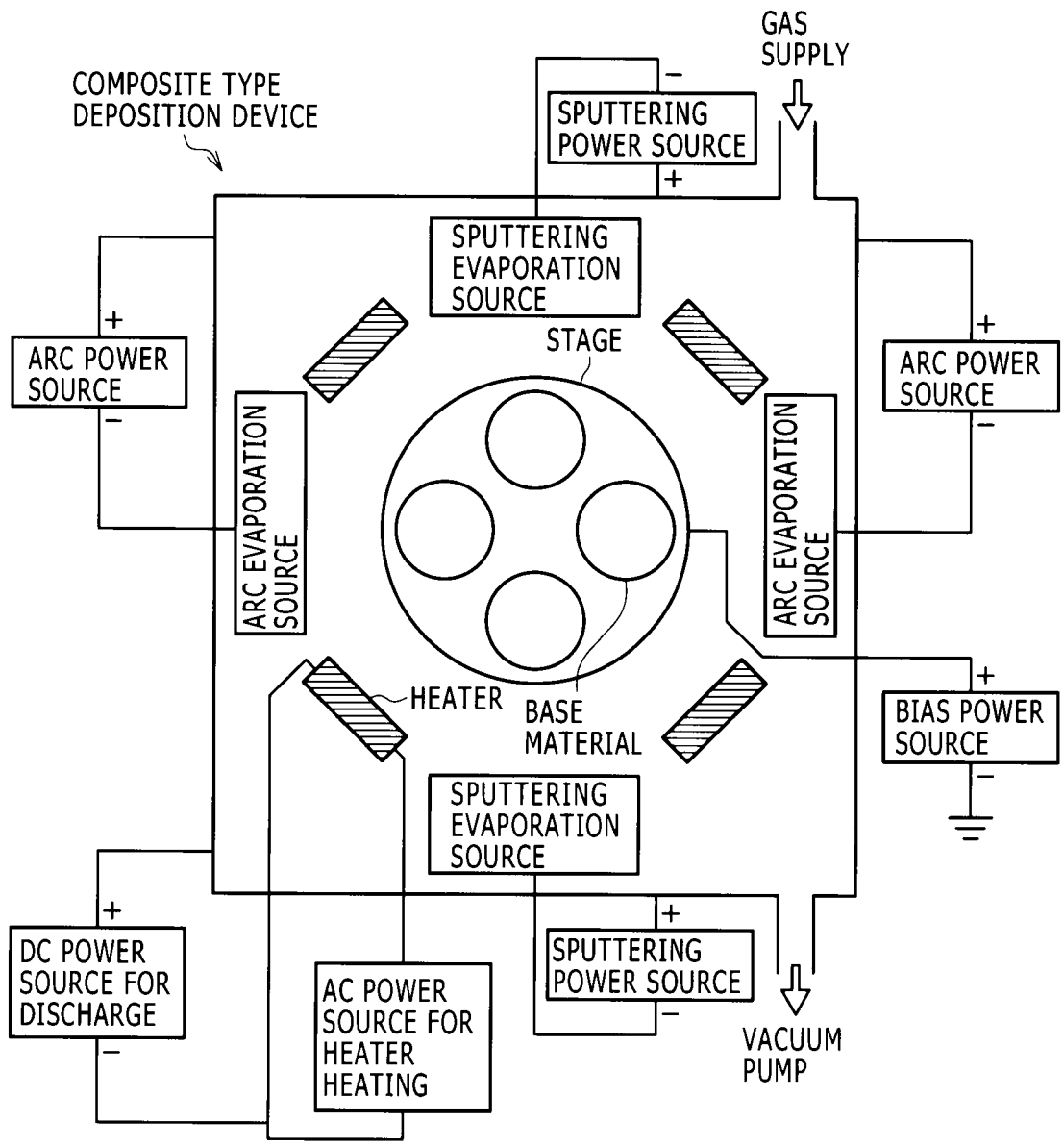

HARD FILM, PLASTIC WORKING DIE, PLASTIC WORKING METHOD, AND TARGET FOR HARD FILM

BACKGROUND OF THE INVENTION

1. Field of the Invention

The present invention relates to a hard film to be formed on the surface of a film-formed product such as a jig or a cutting tool, a plastic working die including the hard film formed therein, a plastic working method using a plastic working die including the hard film formed therein, and a target for a hard film which is for forming the hard film

2. Background Art

Conventionally, plastic working dies using a cemented carbide, a cermet, a high-speed tool steel, or the like as the base material, specifically, jigs such as dies for cold stamping, dies for punching, and forging dies, and cutting tools such as tips, drills, and end mills are each required to have excellent wear resistance and sliding characteristics. For this reason, a hard film is formed on each surface thereof.

For example, in JP-A-2002-371352, there is a description to the effect that a vanadium-based film including one layer or two or more layers of any of VN film, VCN film, and VC film is formed.

Whereas, for example, in JP-A-2008-207219, there is a description to the effect that a film of TiN—TiCN—TiC applicable to use for pressing is formed.

However, the carbide films which are the technologies described in JP-A-2002-371352 and JP-A-2008-207219 are each high in reactivity with an iron-based material, and is unfavorably insufficient in wear resistance particularly for forming of a high-strength steel sheet.

SUMMARY OF THE INVENTION

The present invention was completed in view of the foregoing problem. It is therefore an object of the present invention to provide a hard film excellent in wear resistance, a plastic working die including the hard film formed therein, a plastic working method using a plastic working die including the hard film formed therein, and a target for a hard film which is for forming the hard film.

[1] A hard film in accordance with one aspect of the present invention, includes $(Ti_aCr_bAl_cL_d)(B_xC_yN_z)$ in terms of composition, in which the L is at least one of Si and Y, and the a, b, c, d, x, y, and z each denote the atomic ratio, and satisfy: $0.1 \leq a < 0.3$; $0.3 < b < 0.6$; $0.2 \leq c < 0.35$; $0.01 \leq d < 0.1$; $a+b+c+d=1$; $y \leq 0.1$; $0.8 \leq z \leq 1$; and $x+y+z=1$.

Thus, the hard film in accordance with the present invention includes a nitride of metal elements of Ti, Cr, Al, and L (at least one of Si and Y) in the specific composition ratio. As a result, while the oxide film formed on the surface of the plastic working die is densified, the oxidation resistance and the film hardness can be enhanced. Further, the coefficient of friction can be prevented from increasing. Accordingly, the hard film can acquire an excellent wear resistance. Whereas, inclusion of at least one of B and C as a non-metal element in the specific composition ratio results in a lower coefficient of friction. Accordingly, the hard film is improved in sliding property, and hence, can acquire a more excellent wear resistance.

[2] Then, a hard film in accordance with another aspect of the present invention, includes $(Ti_aCr_bAl_cL_dM_e)(B_xC_yN_z)$ in terms of composition, in which the L is at least one of Si and Y, the M is at least one of the group 4 elements (except for Ti), the group 5 elements, the group 6 elements (except for Cr), and rare earth elements, and the a, b, c, d, e, x, y, and z each denote the atomic ratio, and satisfy: $0.1 \leq a < 0.3$; $0.3 < b < 0.6$; $0.2 \leq c < 0.35$; $0.01 \leq d < 0.1$; $0.01 \leq e \leq 0.1$; $a+b+c+d+e=1$; $x \leq 0.1$; $y \leq 0.1$; $0.8 \leq z \leq 1$; and $x+y+z=1$.

Thus, the hard film in accordance with the present invention includes a nitride of Ti, Cr, Al, and L (at least one of Si and Y), and M (at least one of the group 4 elements (except for Ti), the group 5 elements, and the group 6 elements (except for Cr), and rare earth elements) in the specific composition ratio. As a result, the hard film can be more enhanced in hardness than the hard film of the item [1]. Accordingly, the hard film can acquire a still more excellent wear resistance. Whereas, inclusion of at least one of B and C as a non-metal element in the specific composition ratio results in a lower coefficient of friction. Accordingly, the hard film is improved in sliding property, and hence, can acquire a more excellent wear resistance.

[3] The hard film according to the item [1] or [2] is preferably formed on the surface of a die for plastic working performed at a temperature of 600° C. or less. With this configuration, the hard film can keep the excellent wear resistance.

[4] A plastic working die in accordance with one aspect of the present invention is a plastic working die including a hard film formed on the surface, and is characterized in that the hard film is the hard film according to the item [1] or [2]. With this configuration, when the hard film is formed on the surface of the die, it is possible to implement a plastic working die having an excellent wear resistance.

[5] For the plastic working die according to the item [4], the plastic working die is preferably a die for cold stamping or a die for punching. With this configuration, it is possible to implement a die for cold stamping or a die for punching having an excellent wear resistance.

[6] A plastic working method in accordance with one aspect of the present invention is a plastic working method for performing plastic working of an iron based material. The method includes: performing the plastic working using a plastic working die including the hard film according to the item [1] or [2] formed therein. With this method, the plastic working die for use in plastic working has an excellent wear resistance, and hence can preferably perform plastic working of an iron based material.

[7] For the plastic working method according to the item [6], the plastic working is preferably performed at a temperature of 600° C. or less. With this method, the plastic working die for use in plastic working has an excellent wear resistance. Further, the temperature during working is low. Therefore, plastic working of an iron base material can be more preferably performed.

[8] A target for a hard film in accordance with one aspect of the present invention is a target for a hard film to be used for forming the hard film according to the item [1] or [2]. The target includes $(Ti_aCr_bAl_cL_d)$ in terms of composition, in which the L is at least one of Si and Y, and the a, b, c, and d each denote the atomic ratio, and satisfy: $0.1 \leq a < 0.3$; $0.3 < b < 0.6$; $0.2 \leq c < 0.35$; $0.01 \leq d < 0.1$; and $a+b+c+d=1$. Alternatively, the target includes $(Ti_aCr_bAl_cL_dM_e)$ in terms of composition, in which the L is at least one of Si and Y, the M is at least one of the group 4 elements (except for Ti), the group 5 elements, the group 6 elements (except for Cr), and rare earth elements, and the a, b, c, d, and e each denote the atomic ratio, and satisfy: $0.1 \leq a < 0.3$; $0.3 < b < 0.6$; $0.2 \leq c < 0.35$; $0.01 \leq d < 0.1$; $0.01 \leq e \leq 0.1$; and $a+b+c+d+e=1$.

When such a target for a hard film is used, it is possible to form a hard film including a nitride of metal elements of Ti, Cr, Al, and L (at least one of Si and Y) in the specific composition ratio. Accordingly, it is possible to form a hard film having a low coefficient of friction, a favorable sliding property, and an excellent wear resistance.

[9] It is preferable that the target for a hard film according to the item [8] further includes B. With this configuration, it is possible to form a hard film having a low coefficient of friction, a favorable sliding property, and a more excellent wear resistance.

The hard film in accordance with the present invention includes specific elements in a specific composition, and hence is excellent in wear resistance. For this reason, by forming such a hard film on the surface of a film-formed product such as a plastic working die, it is possible to improve the wear resistance of the film-formed product.

The plastic working die in accordance with the present invention includes, a hard film having an excellent wear resistance resulting from the inclusion of specific elements therein in a specific composition, formed on the surface, and hence, is excellent in wear resistance. In other words, the plastic working die has an excellent wear resistance. This not only can prolong the life of the die, but also can reduce the formation of wear particles. Accordingly, it is possible to reduce the risk of damaging the iron base material which is an object to be worked. As a result, the product manufacturing yield can be improved. Further, the maintenance such as removal of the formed wear particles can be reduced. Therefore, the productivity can be improved.

The plastic working method in accordance with the present invention uses a plastic working die including, a hard film having an excellent wear resistance resulting from the inclusion of specific elements therein in a specific composition, formed on the surface, and hence can preferably perform plastic working of an iron base material. In other words, the plastic working die has an excellent wear resistance. This not only can prolong the life of the die, but also can reduce the formation of wear particles. Accordingly, it is possible to reduce the risk of damaging the iron base material which is an object to be worked. As a result, the product manufacturing yield can be improved. Further, the maintenance such as removal of the formed wear particles can be reduced. Therefore, the productivity can be improved.

The target for a hard film in accordance with the present invention can form a hard film including specific elements therein in a specific composition on the surface of a film-formed product such as a plastic working die. For this reason, the target can impart an excellent wear resistance to the film-formed product.

BRIEF DESCRIPTION OF THE DRAWING

FIG. 1 is a schematic view of a composite type deposition device for depositing a hard film in accordance with the present invention.

DETAILED DESCRIPTION OF THE PREFERRED EMBODIMENTS

Below, a detailed description will be given to a hard film, a plastic working die, a plastic working method, and a target for a hard film in accordance with the present invention.

First, the hard film in accordance with the present invention will be described.

First Embodiment

The hard film in accordance with a first embodiment of the present invention can be formed on each surface of plastic working dies made of iron base alloys (e.g., HSS, SKD11, and SKD61) such as cemented carbides, cermets, high-speed tool steels, specifically, jigs such as dies for cold stamping, dies for punching, and forging dies, and cutting tools such as tips, drills, and end mills (below, these jigs and cutting tools will be simply generically referred to as "film-formed products"). As described later, the hard film in accordance with the present invention includes Cr in a large amount. For this reason, when the hard film is formed on each surface thereof, CrN capable of providing excellent adhesion to the iron base alloy is formed as an underlayer film. This can further enhance the adhesion between the film-formed product and the hard film, which enables use under higher pressure of contacted surface.

Then, the hard film in accordance with the first embodiment includes $(Ti_aCr_bAl_cL_d)(B_xC_yN_z)$ in terms of composition, in which the L is at least one of Si and Y, and the a, b, c, d, x, y, and z each denote the atomic ratio, and satisfy: $0.1 \leq a < 0.3$; $0.3 \leq b < 0.6$; $0.2 \leq c < 0.35$; $0.01 \leq d < 0.1$; $a+b+c+d=1$; $x \leq 0.1$; $y \leq 0.1$; $0.8 \leq z \leq 1$; and $x+y+z=1$.

In other words, the hard film in accordance with the first embodiment is a film including a compound including Ti, Cr, Al, and at least one of Si and Y, and the balance of N as essential elements, and including or not including B and C as given elements.

Ti and Cr are essential for enhancing the hardness of the hard film. However, a high Ti content results in an increase in coefficient of friction with respect to an iron base material which is an object to be worked, which leads to an inferior wear resistance. Therefore, the Ti content is set at less than 0.3 by atomic ratio. Whereas, when the Ti content is too low, the hardness of the hard film cannot be increased. Therefore, the Ti content is set at 0.1 to more by atomic ratio.

Further, Cr has an effect of improving the sliding property with respect to the iron base material which is an object to be worked, and hence is required to be included in a content of more than 0.3 by atomic ratio. However, a content of 0.6 or more results in relatively lower contents of other elements, resulting in a reduction of the wear resistance. The more preferable Cr content is 0.3 to 0.5 by atomic ratio.

Then, the following fact is known: Al, Si, and Y form a dense oxide film excellent in protective property at high temperatures (within the range of generally 800° C. or more), and hence improve the oxidation resistance and the wear resistance at high temperatures. However, when the increase in temperature due to sliding is not large, or in other cases, the oxide film is not sufficiently formed. For this reason, a high content of these elements rather results in a loss of the wear resistance.

Therefore, the Al content was set at less than 0.35 by atomic ratio. Incidentally, Al has actions of not only enhancing the oxidation resistance, but also enhancing the hardness of the hard film by being incorporated in solid solution into the (Ti, Cr) N crystal. Thus, when the Al content is less than 0.2 by atomic ratio, the hardness of such a hard film cannot be enhanced, resulting in a reduction of the wear resistance. The more preferable Al content is 0.25 to 0.3 by atomic ratio.

Whereas, when Si and Y are included in a content of 0.1 or more by atomic ratio, the wear resistance is reduced. For this reason, the content thereof is set at less than 0.1 by atomic ratio. The content thereof is more preferably 0.05 or less. However, addition of trace amounts of them results in refinement of crystal grains of the hard film. This allows enhancement of the hardness of the hard film. For this reason, the content thereof is set at 0.01 or more by atomic ratio.

The hard film of the present invention basically includes a nitride with the composition. However, addition of at least one of B and C in a content of 0.1 or less by atomic ratio as a non-metal element can reduce the coefficient of friction. This enables the improvement of the sliding property. When the content of at least one of B and C exceeds 0.1 by atomic ratio, on the contrary, the hard film is softened, resulting in a loss of the wear resistance.

As described up to this point, by forming the hard film with the composition on the surface of a film-formed product such as a plastic working die, it is possible to improve the wear resistance of the film-formed product.

Second Embodiment

A hard film in accordance with a second embodiment includes $(Ti_aCr_bAl_cL_dM_e)(B_xC_yN_z)$ in terms of composition, in which the L is at least one of Si and Y, the M is at least one of the group 4 elements (except for Ti), the group 5 elements, the group 6 elements (except for Cr), and rare earth elements, and the a, b, c, d, e, x, y, and z each denote the atomic ratio, and satisfy: $0.1 \leq a < 0.3$; $0.3 < b < 0.6$; $0.2 \leq c < 0.35$; $0.01 \leq d < 0.1$; $0.01 \leq e \leq 0.1$, $a+b+c+d+e=1$; $x \leq 0.1$; $y \leq 0.1$; $0.8 \leq z \leq 1$; and $x+y+z=1$.

Incidentally, the hard film in accordance with the second embodiment is roughly the same as the hard film in accordance with the first embodiment, but is different from the hard film in accordance with the first embodiment in that it includes M in a content within the range of $0.01 \leq e \leq 0.1$ by atomic ratio as an essential element of a metal element as described above. Therefore, for the hard film in accordance with the second embodiment, only such a different point will be described. For other elements, the description of the hard film in accordance with the first embodiment will be quoted.

The hard film in accordance with the second embodiment includes, as the M, at least one of the group 4 elements (except for Ti), the group 5 elements, the group 6 elements (except for Cr), and rare earth elements, in an amount of 0.01 or more and 0.1 or less by atomic ratio. As a result, the lattice distortion is induced, so that a nitride with a different lattice constant from that of general TiN, CrN, or AlN can be formed. For this reason, it is possible to achieve a further enhancement of the hardness of the hard film. In other words, the hard film in accordance with the second embodiment can be a still harder film than the hard film in accordance with the first embodiment. Incidentally, as the rare earth elements, mention may be made of Sc, Y, La, Ce, Pr, Nd, Pm, Sm, Eu, Gd, Tb, Dy, Ho, Er, Tm, Yb, and Lu. As the rare earth elements, these may be included therein alone, or in mixture thereof. When these are included therein in mixture, a so-called misch metal can also be used.

When the M content is too small, it is not possible to form a still harder film than the hard film in accordance with the first embodiment. Whereas, when the M content is too large, the film becomes brittle, resulting in a reduction of the wear resistance. Therefore, the M content is set at 0.01 or more and 0.1 or less, and more preferably 0.05 or less by atomic ratio.

The hard film in accordance with the first embodiment and the hard film in accordance with the second embodiment described up to this point are each preferably formed on the surface of a plastic working die for use in plastic working such as cold stamping or punching, whose temperature during working is not a high temperature, and which does not extremely require the oxidation resistance of the hard film.

As a guideline of the operating temperature of the plastic working die including the hard film in accordance with the first embodiment or the hard film in accordance with the second embodiment formed on the surface, the preheat temperature (i.e., working temperature) prior to working of a to-be-worked object is 600° C. or less, more preferably 500° C. or less, further preferably 400° C. or less, still further preferably 300° C. or less, and most preferably room temperature. Particularly, a description will be given thereto in the item of Examples described later.

As a method for forming the hard film in accordance with the first embodiment or the hard film in accordance with the second embodiment on the film-formed product such as a plastic working die, the following may be mentioned.

For example, deposition can be carried out by means of a composite type deposition device having a cathode discharge type arc-type evaporation source shown in FIG. 1. With such a composite type deposition device, a hard film with a film thickness of, for example, 5 μm can be formed on the surface of a film-formed product in the following manner. On a support on a rotating substrate stage, a film-formed product such as a plastic working die is mounted. The inside of the chamber is brought into the vacuum state. Then, the temperature of the film-formed product is heated to about 400° C. by a heater present in the chamber. Thus, sputter cleaning is performed using Ar ions. Then, a target for a hard film having a desirable composition is mounted on a cathode. Thus, in a $N_2$ gas or in a mixture gas of $N_2$ and $CH_4$ with a total pressure of 4 Pa, for example, a 150-A arc current and a −50-V bias voltage are applied.

Incidentally, the method for forming the hard film in accordance with the first embodiment or the hard film in accordance with the second embodiment on a film-formed product such as a plastic working die is not limited thereto. There can also be used an arc ion plating method, an unbalanced magnetron sputtering method, or the like commonly used as a deposition technology.

The target for a hard film includes $(Ti_aCr_bAl_cL_d)$ in terms of composition, in which the L is at least one of Si and Y, and the a, b, c, and d each denote the atomic ratio, and satisfy: $0.1 \leq a < 0.3$; $0.3 < b < 0.6$; $0.2 \leq c < 0.35$; $0.01 \leq d < 0.1$; and $a+b+c+d=1$. In this case, the target includes the metal elements necessary for the formation of the hard film in accordance with the first embodiment in a specific composition. For this reason, only by depositing a film on the surface of a film-formed product with the method using the target for a hard film, it is possible to form the hard film in accordance with the first embodiment.

Alternatively, the target for a hard film includes $(Ti_aCr_bAl_cL_dM_e)$ in terms of composition, in which the L is at least one of Si and Y, the M is at least one of the group 4 elements (except for Ti), the group 5 elements, the group 6 elements (except for Cr), and rare earth elements, and the a, b, c, d, and e each denote the atomic ratio, and satisfy: $0.1 \leq a < 0.3$; $0.3 < b < 0.6$; $0.2 \leq c < 0.35$; $0.01 \leq d < 0.1$; $0.01 \leq e \leq 0.1$; and $a+b+c+d+e=1$. In this case, the target includes the metal elements necessary for the formation of the hard film in accordance with the second embodiment in a specific composition. For this reason, only by depositing a film on the surface of a film-formed product with the method using the target for a hard film, it is possible to preferably form the hard film in accordance with the second embodiment.

The targets for a hard film may further include B in composition thereof. With this composition, a B-containing hard film is formed on the surface of a film-formed product. This can result in a still lower coefficient of friction than that of a hard film not including B. In other words, the target for a hard film can provide a hard film having a still better sliding property and a more excellent wear resistance than those of the hard film not including B.

The target for a hard film described up to this point is desirably configured to have, for example, about 100-mm dia size because of ease of use in the method. However, it is naturally understood that the size of the target is not limited to this size.

Thus, by using the plastic working die including the hard film in accordance with the first embodiment or the hard film in accordance with the second embodiment formed on the surface in this manner, it is possible to preferably perform a plastic working method for performing plastic working of an iron base material. Such a plastic working die including the hard film formed thereon has an excellent wear resistance. This not only can prolong the life of the die, but also can reduce the formation of wear particles. This reduces the possibility of damaging the iron base material which is an object to be worked, which can further reduce the maintenance such as removal of resulting wear particles. Therefore, it is possible to improve the yield of product manufacturing.

As described above, in view of the characteristics of the hard film, plastic working with the plastic working method is desirably carried out at 600° C. or less, more preferably 500° C. or less, further preferably 400° C. or less, still further preferably 300° C. or less, and most preferably at room temperature. This is because too high temperature results in a reduction of the wear resistance.

EXAMPLES

Below, Examples satisfying the requirements of the present invention and Comparative Examples not satisfying the requirements will be more specifically described by way of comparison therebetween.

Using a composite type deposition device having a cathode discharge type arc-type evaporation source, hard films with compositions shown in Nos. 1 to 34 of Table 1 below, and Nos. 35 to 50 shown in Table 2 below were formed. Incidentally, in Table 2, Nos. 33 and 34 shown in Table 1 are shown together for reference.

Herein, as a substrate for forming a hard film thereon, a mirror-polished cemented carbide substrate was used when the composition and the hardness of the hard film were measured; and a SKD11 substrate (hardness: HRC60) was used when a sliding test was performed. In any case of forming either hard film, the base material was introduced into the chamber of the composite type deposition device, and the inside of the chamber was evacuated (evacuated to $1 \times 10^{-3}$ Pa or less). Then, the substrate was heated up to about 400° C. Thereafter, sputter cleaning was carried out with Ar ions. Then, using a 100 mm-dia target, deposition was carried out at an arc current of 150 A, in an atmosphere of $N_2$ or a mixed gas of $N_2+CH_4$ with a total pressure of 4 Pa. The bias to be applied to the substrate was −50 V. Each film thickness of all the hard films was set at 5 μm. Incidentally, the compositions of the metal elements (including B) of targets for forming the hard films of Nos. 1 to 34 of Table 1 and Nos. 35 to 50 of Table 2 are the same as the compositions (atomic ratio) of their respective hard films shown in Tables 1 and 2.

For the substrates each including the hard film thus formed thereon, the hardness test of the hard film was performed. Further, a sliding test with an iron base material as a counter part was carried out to examine the wear resistance. At this step, the composition of the hard film was measured by means of an X-ray microanalyser (electron probe microanalyser; EPMA).

The hardness of the hard film was measured under the conditions of a measurement load of 0.25 N and a measurement time of 15 seconds by means of a micro-Vickers hardness tester.

The sliding test was performed under the following conditions:
(High-Temperature Sliding Test Conditions)
Device: Vane-on-disk type sliding tester
Vane: High tensile strength steel sheet pin (tensile strength 590 MPa)
Disk: SKD11 steel (HRC60) with a film formed thereon
Sliding speed: 0.2 m/sec
Load: 500 N
Sliding distance: 2000 m
Test temperature: room temperature (without heating), 400° C., 600° C.
Evaluation item: Wear depth of the sliding portion (mean at four sites)

In Tables 1 and 2, there are shown, together with the compositions (atomic ratio) of the hard films each formed on the substrate, the hardness [HV] by the micro-Vickers hardness tester, and the wear depth [μm] by the sliding test performed at room temperature. Further, in Table 3, there is shown the wear depth when the test temperature was set at room temperature, 400° C., or 600° C. for the hard film having the composition shown in No. 6 of Table 1 (each as No. 6, No. $6_{(400)}$, or No. $6_{(600)}$). Incidentally, in Tables 1 to 3, the sample showing a wear depth by the sliding test of 4 μm or less was judged as favorable. Further, each underline in Tables 1 to 3 indicates that the value departs from the requirement of the present invention.

TABLE 1

| No. | Composition of hard film (atomic ratio) | | | | | | | | Hardness (HV) | Wear depth (μm) |
| | Ti | Cr | Al | Si | Y | B | C | N | | |
| --- | --- | --- | --- | --- | --- | --- | --- | --- | --- | --- |
| | | | | L | | | | | | |
| 1 | 0.5 | 0 | 0.47 | 0.03 | 0 | 0 | 0 | 1 | 2700 | >5 |
| 2 | 0 | 0.5 | 0.4 | 0.1 | 0 | 0 | 0 | 1 | 2700 | >5 |
| 3 | 0.2 | 0.5 | 0.3 | 0 | 0 | 0 | 0 | 1 | 2800 | 4.5 |
| 4 | 0.2 | 0.49 | 0.3 | 0.01 | 0 | 0 | 0 | 1 | 2950 | 3 |
| 5 | 0.2 | 0.47 | 0.3 | 0.03 | 0 | 0 | 0 | 1 | 3300 | 0.5 |
| 6 | 0.2 | 0.45 | 0.3 | 0.05 | 0 | 0 | 0 | 1 | 3200 | 0.8 |
| 7 | 0.2 | 0.42 | 0.3 | 0.08 | 0 | 0 | 0 | 1 | 3000 | 2.5 |
| 8 | 0.2 | 0.35 | 0.3 | 0.15 | 0 | 0 | 0 | 1 | 2600 | >5 |
| 9 | 0.25 | 0.55 | 0.15 | 0.05 | 0 | 0 | 0 | 1 | 2500 | >5 |
| 10 | 0.2 | 0.55 | 0.2 | 0.05 | 0 | 0 | 0 | 1 | 2900 | 3.5 |
| 6 | 0.2 | 0.45 | 0.3 | 0.05 | 0 | 0 | 0 | 1 | 3200 | 0.8 |
| 11 | 0.2 | 0.35 | 0.4 | 0.05 | 0 | 0 | 0 | 1 | 2800 | >5 |
| 12 | 0.34 | 0.25 | 0.33 | 0.08 | 0 | 0 | 0 | 1 | 2700 | >5 |
| 13 | 0.28 | 0.34 | 0.33 | 0.05 | 0 | 0 | 0 | 1 | 3250 | 0.7 |

TABLE 1-continued

| | Composition of hard film (atomic ratio) | | | | | | | | Hardness | Wear depth |
|---|---|---|---|---|---|---|---|---|---|---|
| | | | | | L | | | | | |
| No. | Ti | Cr | Al | Si | Y | B | C | N | (HV) | (μm) |
| 14 | 0.12 | 0.5 | 0.33 | 0.05 | 0 | 0 | 0 | 1 | 3300 | 0.5 |
| 15 | 0.15 | 0.55 | 0.25 | 0.05 | 0 | 0 | 0 | 1 | 3300 | 0.5 |
| 16 | 0.1 | 0.65 | 0.2 | 0.05 | 0 | 0 | 0 | 1 | 2700 | >5 |
| 17 | 0 | 0.59 | 0.33 | 0.08 | 0 | 0 | 0 | 1 | 2600 | >5 |
| 18 | 0.1 | 0.55 | 0.3 | 0.05 | 0 | 0 | 0 | 1 | 2900 | 2 |
| 6 | 0.2 | 0.45 | 0.3 | 0.05 | 0 | 0 | 0 | 1 | 3200 | 0.8 |
| 19 | 0.27 | 0.38 | 0.3 | 0.05 | 0 | 0 | 0 | 1 | 3100 | 1.1 |
| 20 | 0.35 | 0.35 | 0.25 | 0.05 | 0 | 0 | 0 | 1 | 2650 | >5 |
| 21 | 0.2 | 0.48 | 0.3 | 0 | 0.02 | 0 | 0 | 1 | 3200 | 0.5 |
| 22 | 0.2 | 0.45 | 0.3 | 0 | 0.05 | 0 | 0 | 1 | 3000 | 1.2 |
| 23 | 0.2 | 0.42 | 0.3 | 0 | 0.08 | 0 | 0 | 1 | 2900 | 2.5 |
| 24 | 0.2 | 0.35 | 0.3 | 0 | 0.15 | 0 | 0 | 1 | 2750 | >5 |
| 25 | 0.25 | 0.4 | 0.3 | 0.03 | 0.02 | 0 | 0 | 1 | 3350 | 04 |
| 26 | 0.22 | 0.4 | 0.3 | 0.05 | 0.03 | 0 | 0 | 1 | 3200 | 0.8 |
| 27 | 0.16 | 0.4 | 0.3 | 0.07 | 0.07 | 0 | 0 | 1 | 2750 | >5 |
| 6 | 0.2 | 0.45 | 0.3 | 0.05 | 0 | 0 | 0 | 1 | 3200 | 08 |
| 28 | 0.2 | 0.45 | 0.3 | 0.05 | 0 | 0.08 | 0 | 0.92 | 3200 | 06 |
| 29 | 0.2 | 0.45 | 0.3 | 0.05 | 0 | 0.2 | 0 | 0.8 | 2500 | >5 |
| 30 | 0.2 | 0.45 | 0.3 | 0.05 | 0 | 0 | 0.1 | 0.9 | 3100 | 1.5 |
| 31 | 0.2 | 0.45 | 0.3 | 0.05 | 0 | 0 | 0.3 | 0.7 | 2600 | >5 |
| 32 | 0.2 | 0.45 | 0.3 | 0.05 | 0 | 0.05 | 0.1 | 0.85 | 3000 | 1.9 |
| 33 | | | | V0.5C0.5 | | | | | 3000 | >5 |
| 34 | | | | Ti0.5C0.5 | | | | | 3000 | >5 |

TABLE 2

| | Composition of hard film (atomic ratio) | | | | | | | | Hardness | Wear depth |
|---|---|---|---|---|---|---|---|---|---|---|
| No. | Ti | Cr | Al | Si | Element M | B | C | N | (HV) | (μm) |
| 35 | 0.2 | 0.4 | 0.3 | 0.05 | V: 0.05 | 0 | 0 | 1 | 3200 | 0.7 |
| 36 | 0.2 | 0.4 | 0.3 | 0.05 | Zr: 0.05 | 0 | 0 | 1 | 2900 | 2.6 |
| 37 | 0.2 | 0.4 | 0.3 | 0.05 | Nb: 0.05 | 0 | 0 | 1 | 3100 | 1.5 |
| 38 | 0.2 | 0.4 | 0.3 | 0.05 | Ta: 0.05 | 0 | 0 | 1 | 3000 | 2 |
| 39 | 0.2 | 0.4 | 0.3 | 0.05 | Mo: 0.05 | 0 | 0 | 1 | 3200 | 0.6 |
| 40 | 0.2 | 0.4 | 0.3 | 0.05 | W: 0.05 | 0 | 0 | 1 | 3250 | 0.5 |
| 41 | 0.2 | 0.4 | 0.3 | 0.05 | Ce: 0.05 | 0 | 0 | 1 | 3100 | 1 |
| 42 | 0.2 | 0.4 | 0.3 | 0.05 | Sm: 0.05 | 0 | 0 | 1 | 3200 | 0.8 |
| 43 | 0.2 | 0.4 | 0.3 | 0.05 | Ho: 0.05 | 0 | 0 | 1 | 3150 | 1.1 |
| 44 | 0.15 | 0.3 | 0.3 | 0.05 | Sm: 0.2 | 0 | 0 | 1 | 2600 | >5 |
| 45 | 0.05 | 0.55 | 0.3 | 0.05 | V: 0.05 | 0 | 0 | 1 | 2700 | >5 |
| 46 | 0.4 | 0.31 | 0.2 | 0.04 | V: 0.05 | 0 | 0 | 1 | 2600 | >5 |
| 47 | 0.26 | 0.25 | 0.34 | 0.05 | V: 0.1 | 0 | 0 | 1 | 2650 | >5 |
| 48 | 0.1 | 0.65 | 0.2 | 0.01 | V0.04 | 0 | 0 | 1 | 2700 | >5 |
| 49 | 0.25 | 0.5 | 0.1 | 0.1 | V: 0.05 | 0 | 0 | 1 | 2600 | >5 |
| 50 | 0.1 | 0.35 | 0.5 | 0.02 | V: 0.03 | 0 | 0 | 1 | 2500 | >5 |
| 33 | | | | V0.5C0.5 | | | | | 3000 | >5 |
| 34 | | | | Ti0.5C0.5 | | | | | 3000 | >5 |

TABLE 3

| | Composition of hard film (atomic ratio) | | | | | | | | Hardness | Sliding | Wear depth |
|---|---|---|---|---|---|---|---|---|---|---|---|
| | | | | | L | | | | | | |
| No. | Ti | Cr | Al | Si | Y | B | C | N | (HV) | temperature | (μm) |
| 6 | 0.2 | 0.45 | 0.3 | 0.05 | 0 | 0 | 0 | 1 | 3200 | Room temperature | 0.8 |
| 6(400) | 0.2 | 0.45 | 0.3 | 0.05 | 0 | 0 | 0 | 1 | 3200 | 400 | 1.2 |
| 6(600) | 0.2 | 0.45 | 0.3 | 0.05 | 0 | 0 | 0 | 1 | 3200 | 600 | 3 |
| 33(400) | | | | V0.5C0.5 | | | | | 3000 | 400 | >5 |
| 34(400) | | | | T0.5C0.5 | | | | | 3000 | 400 | >5 |

For Nos. 4 to 7, 10, 13 to 15, 18, 19, 21 to 23, 25, 26, 28, 30, and 32 shown in Table 1, the composition of each hard film satisfied the requirements of the present invention. Therefore, each wear depth was 4 μm or less.

In contrast, for No. 1 shown in Table 1, the atomic ratio of Ti was 0.3 or more, the atomic ratio of Cr was 0.3 or less, and the atomic ratio of Al was 0.35 or more. Therefore, the wear depth was deeper than 4 μm.

Whereas, for No. 2 shown in Table 1, the atomic ratio of Ti was less than 0.1, the atomic ratio of Al was 0.35 or more, and the atomic ratio of L (Si) was 0.1 or more. Therefore, the wear depth was deeper than 4 μm.

For No. 3 shown in Table 1, the atomic ratio of L (Si+Y) was less than 0.01. Therefore, the wear depth was deeper than 4 μm.

For No. 8 shown in Table 1, the atomic ratio of L (Si) was 0.1 or more. Therefore, the wear depth was deeper than 4 μm.

For No. 9 shown in Table 1, the atomic ratio of Al was less than 0.2. Therefore, the wear depth was deeper than 4 μm.

For No. 11 shown in Table 1, the atomic ratio of Al was 0.35 or more. Therefore, the wear depth was deeper than 4 μm.

For No. 12 shown in Table 1, the atomic ratio of Ti was 0.3 or more, and the atomic ratio of Al was 0.3 or less. Therefore, the wear depth was deeper than 4 μm.

For No. 16 shown in Table 1, the atomic ratio of Cr was 0.6 or more. Therefore, the wear depth was deeper than 4 μm.

For No. 17 shown in Table 1, the atomic ratio of Ti was less than 0.1. Therefore, the wear depth was deeper than 4 μm.

For No. 20 shown in Table 1, the atomic ratio of Ti was 0.3 or more. Therefore, the wear depth was deeper than 4 μm.

For No. 24 shown in Table 1, the atomic ratio of L (Si) was 0.1 or more. Therefore, the wear depth was deeper than 4 μm.

For No. 27 shown in Table 1, the atomic ratio of L (Si+Y) was 0.1 or more. Therefore, the wear depth was deeper than 4 μm.

For No. 29 shown in Table 1, the atomic ratio of B was more than 0.1. Therefore, the wear depth was deeper than 4 μm.

For No. 31 shown in Table 1, the atomic ratio of C was more than 0.1, and the atomic ratio of N was less than 0.8. Therefore, the wear depth was deeper than 4 μm.

No. 33 shown in Table 1 was a VC film including V in an amount of 0.5 by atomic ratio, and C in an amount of 0.5 by atomic ratio. No. 34 was a TiC film including Ti in an amount of 0.5 by atomic ratio, and C in an amount of 0.5 by atomic ratio. In both cases, the films were hard films different in type from those of the present invention. Therefore, the wear depth was deeper than 4 μm.

Whereas, for Nos. 35 to 43 shown in Table 2, the composition of each hard film satisfied the requirements of the present invention. Therefore, the wear depth was 4 μm or less. Further, for Nos. 35 to 43 shown in Table 2, each hard film included, as the element M, at least one of the group 4 elements (except for Ti), the group 5 elements, the group 6 elements (except for Cr), and rare earth elements. Therefore, each hard film tended to have a higher hardness than those of Nos. 4 to 7, 10, 13 to 15, 18, 19, 21 to 23, 25, 26, 28, 30, and 32 shown in Table 1.

In contrast, for No. 44 shown in Table 2, the atomic ratio of the element M (Sm) exceeded 0.1. Therefore, the wear depth was deeper than 4 μm.

Further, for No. 45 shown in Table 2, the atomic ratio of the element M satisfied the requirements of the present invention. However, the atomic ratio of Ti was less than 0.1. Therefore, the wear depth was deeper than 4 μm.

For No. 46 shown in Table 2, the atomic ratio of the element M satisfied the requirements of the present invention. However, the atomic ratio of Ti was 0.3 or more. Therefore, the wear depth was deeper than 4 μm.

For No. 47 shown in Table 2, the atomic ratio of the element M satisfied the requirements of the present invention. However, the atomic ratio of Cr was 0.3 or less. Therefore, the wear depth was deeper than 4 μm.

For No. 48 shown in Table 2, the atomic ratio of the element M satisfied the requirements of the present invention. However, the atomic ratio of Cr was 0.6 or more. Therefore, the wear depth was deeper than 4 μm.

For No. 49 shown in Table 2, the atomic ratio of the element M satisfied the requirements of the present invention. However, the atomic ratio of Al was less than 0.2, and the atomic ratio of L (Si) was 0.1 or more. Therefore, the wear depth was deeper than 4 μm.

For No. 50 shown in Table 2, the atomic ratio of the element M satisfied the requirements of the present invention. However, the atomic ratio of Al was 0.35 or more. Therefore, the wear depth was deeper than 4 μm.

Then, Nos. 6, $6_{(400)}$, and $6_{(600)}$ shown in Table 3 were hard films satisfying the requirements of the present invention. Therefore, the wear depth was 4 μm or less in any of the cases where the test temperatures of the sliding test were room temperature, 400° C., and 600° C. However, for No. $6_{(400)}$, the test temperature of the sliding test was 400° C., and for No. $6_{(600)}$, the test temperature of the sliding test was 600° C. Therefore, the wear depth was deeper as compared with No. 6 for which the test temperature of the sliding test was room temperature. However, in both cases, the wear depth was not deeper than 4 μm. Further, the results indicate as follows: when the sliding test is performed at a sliding temperature of 400° C. or less, the wear depth becomes less likely to be larger than in the case where the sliding test is performed at 600° C.; in other words, the excellent wear resistance can be kept.

In contrast, Nos. $33_{(400)}$ and $34_{(400)}$ shown in Table 3 were hard films of different type from that of the present invention. The test temperature of the sliding test was as high as 400° C. Therefore, the wear depth was deeper than 4 μm.

What is claimed is:

1. A hard film comprising a composition represented by the formula $(Ti_aCr_bAl_cL_d)(B_xC_yN_z)$, wherein L is at least one of Si and Y, and a, b, c, d, x, y, and z each represents the atomic ratio, and satisfy:

$$0.1 \leq a < 0.3;$$

$$0.3 < b < 0.6;$$

$$0.2 \leq c < 0.35;$$

$$0.01 \leq d < 0.1;$$

$$a+b+c+d=1;$$

$$x \leq 0.05;$$

$$y \leq 0.1;$$

$$0.8 \leq z \leq 1; \text{ and}$$

$$x+y+z=1.$$

2. A hard film comprising a composition represented by the formula $(Ti_aCr_bAl_cL_dM_e)(B_xC_yN_z)$, wherein L is at least one of Si and Y, M is at least one element selected from the group consisting of the group 4 elements except for Ti, the group 5 elements, the group 6 elements except for Cr, and rare earth elements, and a, b, c, d, e, x, y, and z each represents the atomic ratio, and satisfy:

$0.1 \leq a < 0.3$;

$0.3 < b < 0.6$;

$0.2 \leq c < 0.35$;

$0.01 \leq d < 0.1$;

$0.01 \leq e \leq 0.1$;

$a+b+c+d+e=1$;

$x \leq 0.05$;

$y \leq 0.1$;

$0.8 \leq z \leq 1$; and $x+y+z=1$.

3. The hard film according to claim 1, for forming on the surface of a die for plastic working performed at a temperature of 600° C. or less.

4. The hard film according to claim 2, for forming on the surface of a die for plastic working performed at a temperature of 600° C. or less.

* * * * *